United States Patent [19]
Maeda

[11] 4,403,307
[45] Sep. 6, 1983

[54] SEMICONDUCTOR MEMORY DEVICE

[75] Inventor: Koh-ichi Maeda, Yokohama, Japan

[73] Assignee: Fujitsu Limited, Kawasaki, Japan

[21] Appl. No.: 280,008

[22] PCT Filed: Nov. 6, 1980

[86] PCT No.: PCT/JP80/00276
§ 371 Date: Jul. 2, 1981
§ 102(e) Date: Jul. 2, 1981

[87] PCT Pub. No.: WO81/01484
PCT Pub. Date: May 28, 1981

[30] Foreign Application Priority Data
Nov. 12, 1979 [JP] Japan ................................ 54-146167

[51] Int. Cl.$^3$ ........................ G11C 11/40; H01L 29/78
[52] U.S. Cl. ...................................... 365/174; 357/22; 357/23
[58] Field of Search ................. 357/22; 365/174, 182, 365/185

[56] References Cited
U.S. PATENT DOCUMENTS
4,257,056  3/1981  Shum .................................. 365/185

Primary Examiner—Terrell W. Fears
Attorney, Agent, or Firm—Staas & Halsey

[57] ABSTRACT

The present invention discloses a semiconductor memory device composed of double gate type field effect transistors which have control gate and floating gate for accumulating charges. The conditions for optimum charge injection writing and for optimum reading of this semiconductor memory device are mutually inconsistent. In order to satisfy said two conditions, the present invention provides a charge injection transistor and a read transistor, wherein the floating gate of both transistors are electrically connected, the control gates are connected to a first signal lines, the drains are connected respectively to the different second and third signal lines and the sources are grounded.

11 Claims, 8 Drawing Figures

SEMICONDUCTOR MEMORY DEVICE

BACKGROUND OF THE INVENTION

The present invention relates to a semiconductor memory device composed of double gate type field effect transistors having control gates and floating gates for accumulating charges. Moreover, it relates to a semiconductor memory device which assures high charge injection efficiency and also high read-out efficiency.

Some nonvolatile semiconductor memory devices use double gate type field effect transistors as the memory elements. FIG. 1 shows a sectional view of the conventional double gate type field effect transistor. The structure and principle or operation of a transistor of this type are disclosed in U.S. Pat. No. 3,984,822.

The transistor shown in FIG. 1 includes, on a silicon semiconductor substrate 10 of the one conductivity type (P type), a source region 11 of the opposite conductivity type (N type), a drain region 12, an electrically floating gate 13, and a control gate 15. The reference numeral 14 is an insulating layer (silicon oxide), while 16 represents lead-out electrodes connected to the source 11 and drain 12. Reference number 17 is a high concentration region of the first conductivity type (P type).

The operation of this transistor as a memory element is explained hereunder.

(a) Injection of charge into the floating gate as the write operation:

First, the substrate 10 and source region 11 are set to the same potential (ground potential), and a positive voltage of about 15 V, for example, is applied to the drain region 12 while a positive voltage of about 20 V (write voltage), for example, is applied to the control gate 15. In this condition, the transistor is fully saturated, and the channel between the source region 11 and drain region 12 is in the pinch-off condition and the carriers of the channel are sufficiently accelerated by the high electrical field in the depletion layer between the pinch-off point and the drain region 12 to cause impact ionization. As a result, the avalanche phenomenon of electrons occurs. In this condition, a many carriers (hot carriers) having a high energy exists in the depletion layer between the pinch-off point and the drain region 12. The hot electrons having an energy higher in amount than the energy barrier between the substrate 10 and insulating layer 14 move in the insulating layer 14 due to the field between the control gate 15 and substrate 10 and then are injected into the floating gate 13.

In case the substrate 10 is N type and both source region 11 and drain region 12 are P type, the direction of the field is inverted from the abovementioned operation and holes are injected into the floating gate 13. Once the charge is injected into the floating gate 13, such charge is accumulated semi-permanently in the floating gate 13. The difference of conductivity of the channel of the transistor due to the existence of the accumulated charge is used as the stored information.

(b) Read-out operation:

When electrons are accumulated in the floating gate 13, the threshold voltage becomes high. Therefore, an intermediate voltage (read-out voltage) between the threshold voltage when no electrons are accumulated and that when electrons are accumulated is applied to the control gate 15. The transistor has a low conductivity or is not conductive when electrons are accumulated in the floating gate 13, or has a high conductivity when electrons are not accumulated.

(c) Erasure or removal of charges:

Charges can be removed by irrading the transistor with ultra-violet rays and other electromagnetic waves or radioactive rays.

In the prior art in order to more efficiently execute the write operation explained above, the high concentration region 17 (of the same conductivity type (P type) as the substrate 10) is formed on the substrate 10 between the source region 11 and drain region 12. Formation of this high concentration region 17 narrow the depletion layer existing in the channel near the drain region at the time of the write operation. Therefore, the electrical field in the depletion layer is intensified and as a result the energy of carriers accelerated in the depletion layer becomes high, also increasing the probability of hot carrier generation. As a result, the efficiency of injecting hot carriers into the floating gate 13 is improved. This lowers the write voltage.

However, the read-out operation efficiency is degraded when the high concentration region 17 is provided. Namely, since the channel concentration becomes heavy, the threshold voltage becomes high and the conductance gm of a transistor becomes small. Thus, a high power supply voltage is required in order to increase the read-out voltage to be applied to the control gate 15. Moreover, in the event that the read-out voltage is lowered, the difference between the threshold voltage when no electrons are injected to the floating gate 13 and the read-out voltage becomes small, slowing the read-out operation. On the other hand, it is conceivable to widen the channel of the transistor in order to increase the conductance gm, but this would also increase the area occupied by the transistor and tend to reduce the integration density. Obtaining the high concentration channel is equivalent to the setting of inconvenient conditions for a highly efficient read-out operation.

SUMMARY OF THE INVENTION

It is an object of the present invention to offer a semiconductor memory device having double gate type field effect transistors and ensuring high write and read-out efficiency.

It is another object of the present invention to offer a semiconductor memory device having double gate type field effect transistors and low write and read-out voltages.

It is further object of the present invention to offer a semiconductor memory device having double gate type field effect transistors which can inject the hot carriers generated in the channel into the floating gate with high efficiency.

It is still a further object of the present invention to offer a semiconductor memory device having double gate type field effect transistors which assure a low threshold voltage and large conductance gm in the read-out operation.

A semiconductor memory device having double gate type field effect transistors of the present invention is provided with one transistor used only for charge injection and another used only for the read-out operation, these transistors each having source and drain regions of one conductivity type formed at isolated positions a substrate surface having the opposite conductivity type, the floating gate being formed between said source region and drain region on said substrate and the control gate being isolated from said floating gate via an insulator, wherein said floating gates of the transistor used only for charge injection and the transistor used only for the read-out operation are connected electrically, said control gates for both transistors are connected to a first signal line (word line), said drains are connected respectively to different second and third signal lines (bit lines) and said sources are connected to the same power supply, both transistors mentioned above being designed with the optimum condition in regard to the impurity concentration in the substrate between said source and drain regions and the design conditions of each part of said transistors.

DESCRIPTION OF THE PREFERRED EMBODIMENTS

In the present invention, a memory cell has one transistor used only for charge injection and another used only for the read-out operation so that the cell can accomplish the write operation by injecting charges and the read-out operation.

Figure 1:
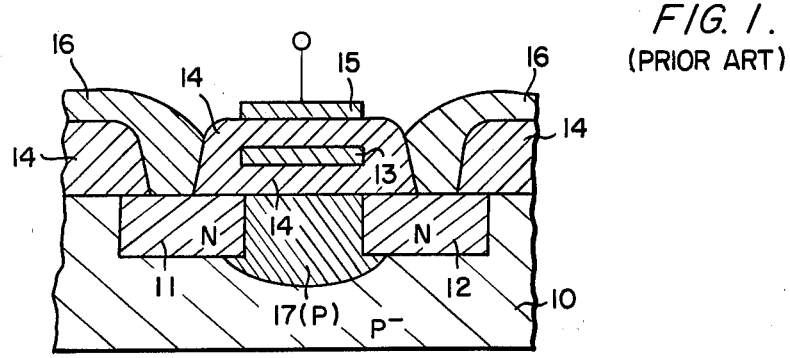
FIG. 1 shows a sectional view indicating the structure of the conventional double gate type field effect transistor.
Figure 2:
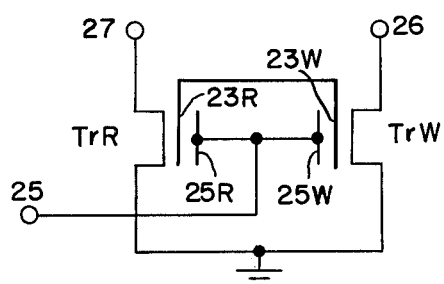
FIG. 2 shows the schematic diagram of a memory cell having double gate type field effect transistors related to an embodiment of the present invention.

FIG. 2 shows a schematic diagram related to an embodiment of the present invention.

The floating gates 23W, 23R of the transistor $T_{rW}$ (only for charge injection) and the transistor $T_{rR}$ (only for the read-out operation) are electrically connected. Therefore, when a charge is injected to the floating gate 23W from the transistor $T_{rW}$, it is also injected to the floating gate 23R of the transistor $T_{rR}$. The control gate 25W of the transistor $T_{rW}$ and the control gate 25R of the transistor $T_{rR}$ are connected in common to a first signal line 25, the drain of the transistor $T_{rW}$ is connected to a second signal line 26, the drain of the transistor $T_{rR}$ is connected to a third signal line 27, and the sources of both transistors $T_{rW}$, $T_{rR}$ are connected in common.

Figure 3:
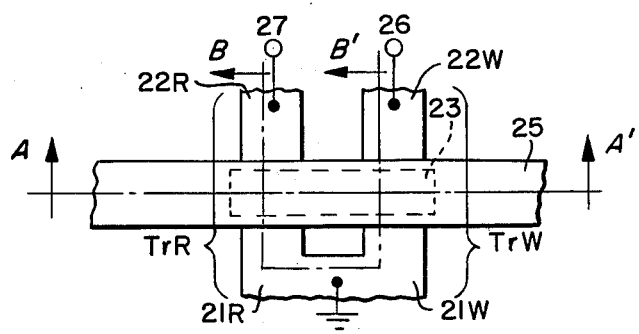
FIG. 3 shows the outline of a plan view indicating the structure of the memory cell of FIG. 2.

FIG. 3 outlines a plan view indicating the structure of the memory cell shown in FIG. 2. The transistors $T_{rW}$, $T_{rR}$ have a common floating gate 23. In addition, the control gates are formed with the first signal line 25. 22W, 22R are drain regions and 21W, 21R are source regions which are composed of the common diffused layers.

Figure 4:
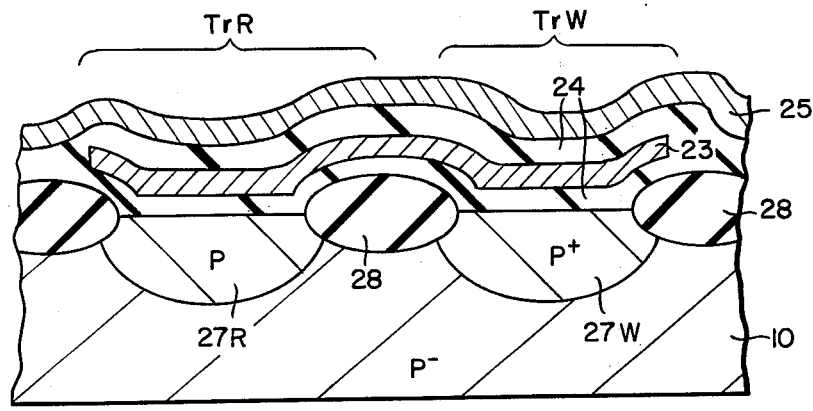
FIG. 4 and FIG. 5 show sectional views taken along the lines A—A' and B—B' of FIG. 3.
Figure 5:
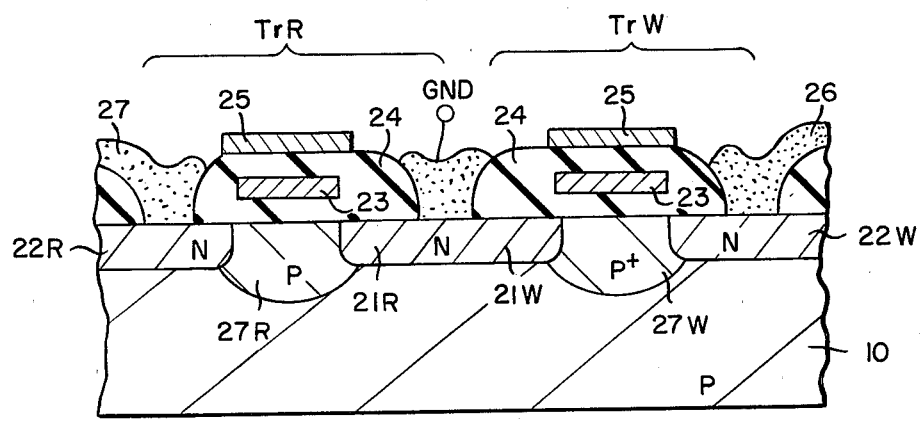

FIG. 4 and FIG. 5 show the sectional view along the line A—A' of FIG. 3 and the sectional view along the line B—B'. The reference numerals given respective portions of the figures are the same as those in FIG. 3.

In these figures, 24, 28 are insulating layers. The first signal line 25 and the floating gate 23 are composed of, for example, polycrystalline silicon layers, while the insulating layers 24, 28 are composed of, for example, silicon oxide layers.

In the case of this embodiment, the semiconductor substrate 10, consisting of the silicon, has P type conductivity, while the source regions 21R, 21W and the drain regions 22W, 22R have N type conductivity.

Each portion of the transistor $T_{rW}$ (only for charge injection) and the transistor $T_{rR}$ (only for the read-out operation) is designed respectively under the optimum condition. For example, in both transistors $T_{rW}$, $T_{rR}$, the high concentration regions 27W, 27R are higher in the concentration of P type impurity than the substrate 10, and the concentration in the region 27R is lower than in the region 27W.

The operation of this embodiment of the memory cell is explained hereunder.

(a) Write operation by charge injection:

Only the transistor $T_{rW}$ is used for charge injection. The substrate 10 and the source 21W are grounded and a positive high voltage is applied to the first signal line 25 and the 2nd signal line 26. Since the high impurity concentration region 27W is provided in the channel of transistor $T_{rW}$, the probability of generating hot carriers is high and the write efficiency is very excellent. Particularly, since the transistor $T_{rW}$ is not required to satisfy the design condition required for the read-out operation as opposed to the design condition for writing efficiency, the efficiency of charge injection in the transistor $T_{rW}$ is fantastically excellent as compared with the prior art mentioned above. Therefore, the write operation is carried out at a high speed. Moreover, even when the voltage to be applied to the second signal line is lowered, a charge injection efficiency equal to the conventional one is obtained. Therefore, the write voltage can be lowered. In the case of this embodiment, the charges injected are electrons, and holes are injected in the event that the conductivity type of substrate and the source/drain regions is inverted. In this case, the above-mentioned effect can also be obtained.

(b) Read-out operation:

Only the transistor $T_{rR}$ is used for the read-out operation. First, the substrate 10 and the source 21R are grounded and the specified read-out operation is applied to the first signal line 25. As this read-out voltage, an intermediate voltage between the threshold voltages for accumulating or not accumulating charges in the floating gate 23 is used. Thus, the stored information can be read by detecting the difference of in conductivity of transistor $T_{rR}$ due to the existence or nonexistence of the injected charge in the floating gate 23 through detection of a voltage or current on the third signal line 27 at that time. The impurity concentration of the high concentration region 27R of the channel of the transistor $T_{rR}$ is lower than that of the region 27W and is also lower than that of the high concentration region 17 of the conventional transistor explained above. Therefore, the threshold voltage becomes lower and the conductance gm becomes higher. For this reason, the write voltage can be lowered. Moreover, since the difference between the threshold voltage when no electrons are injected and the read-out voltage is larger than that of the prior art even when the read-out voltage is sufficiently low, high speed read-out operation can be realized.

As explained above, the write operation and the read-out operation are performed efficiently.

Other conditions of the transistors $T_{rW}$, $T_{rR}$ can be optimized as a result of the abovementioned impurity concentration of the high concentration regions 27W, 27R provided at the channel. Namely, the transistor $T_{rW}$ is not required to have a large conductance gm. As a result the channel width need not be widened in order to increase the conductance gm, unlike the conventional transistor. Therefore, the area occupied by the transistor $T_{rW}$ can be reduced as compared with the conventional one. In addition, since the transistor $T_{rR}$ has a sufficiently low threshold voltage and sufficiently high conductance gm, there is no need to widen the channel as is done in the conventional transistor. As a result, the area occupied by the transistor $T_{rR}$ can also be reduced as compared with the conventional one.

Figure 6:
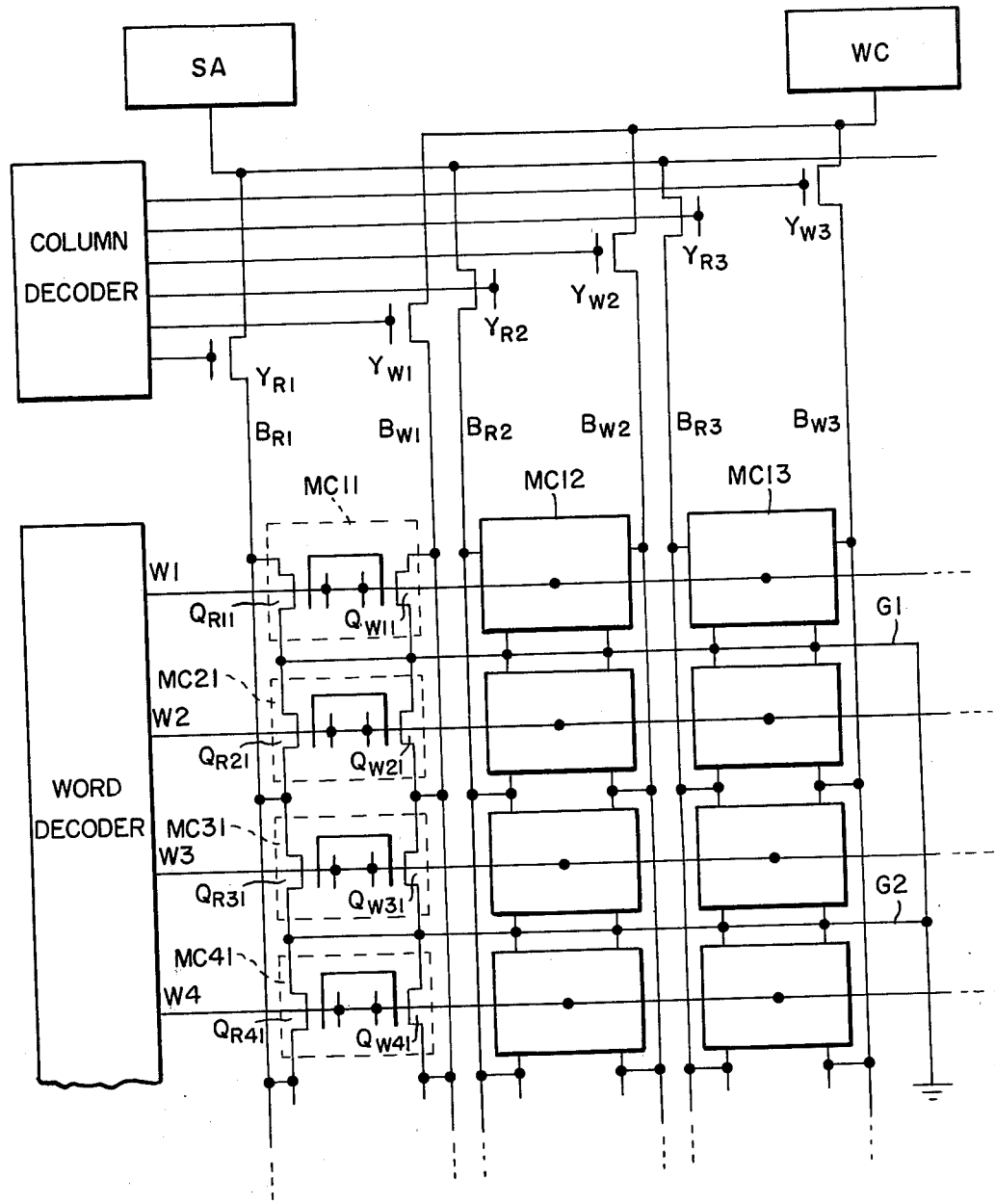
FIG. 6 outlines the schematic diagram of a semiconductor memory device related to an embodiment of the present invention.

FIG. 6 outlines a schematic diagram of a semiconductor memory device of an embodiment of the present invention. In this embodiment, the memory cells MC11, MC12 . . . respectively have the same structure as FIGS. 3, 4, 5 described above. As the first signal lines, the word lines $W_1$, $W_2$, . . . are used, while as the second and third signal lines, the charge injection bit lines $B_{w1}$, $B_{w2}$ . . . and the read-out bit lines $B_{R1}$, $R_{R2}$, . . . respectively are used. These signal lines are connected to the transistors $Q_{w11}$, $Q_{R11}$ . . . of the memory cells MC11, MC12 . . . , and G1, G2 are grounded common source regions. The transistors $Y_{w1}$, $Y_{w2}$, . . . connect, in accordance with the signal of a column decoder, the charge injection bit lines $B_{w1}$, $B_{w2}$ . . . (which are connected to the charge injection transistors $Q_{w11}$, $Q_{w12}$ . . . of the selected memory cells) with charge injection circuit WC. The transistors $Y_{R1}$, $Y_{R2}$ . . . connect the read-out bit lines $B_{R1}$, $B_{R2}$ . . . (which are connected to the read-out transistors $Q_{R11}$, $Q_{R12}$ . . . ) with a sense amplifier SA.

The write operation and read operation of the memory cells MC11, MC12 . . . are similar to those explained previously.

Figure 7:
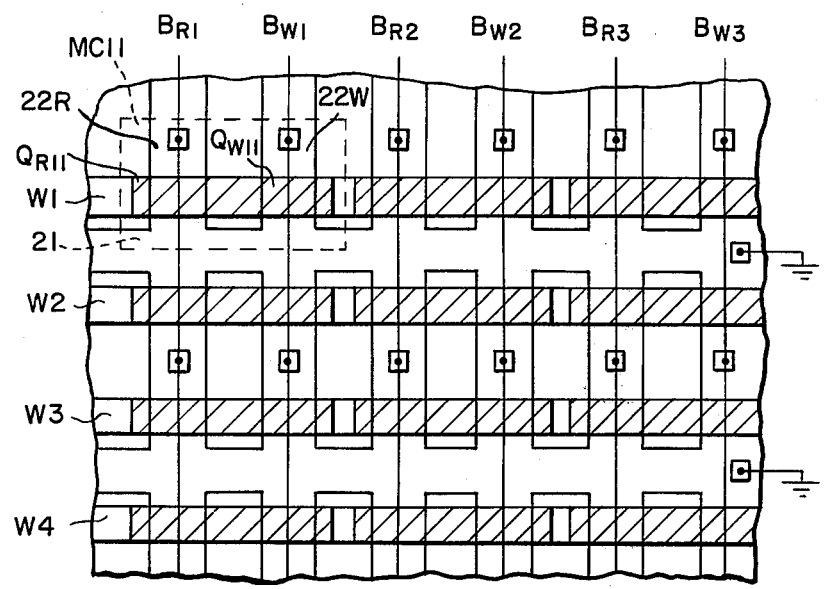
FIG. 7 shows the outline of a plan view indicating the structure of a memory cell shown in FIG. 6.

FIG. 7 outlines a plan view indicating the structure of the schematic diagram of FIG. 6. The word lines $W_1$, $W_2$ . . . are arranged in parallel to the horizontal direction, and the hatched portions indicate floating gates formed by polycrystalline silicon layers. The portion enclosed by the broken line indicates the area of a single memory cell MC11. 22W is the drain region of transistor $Q_{w11}$, 22R is the drain region of transistor $Q_{R11}$, 21 is the common source region, and 22W, 22R and 21 are all composed of impurity diffused regions provided on the substrate. The drain regions 22W and 22R are respectively connected to the bit lines $B_{w1}$, $B_{R1}$. The bit lines $B_{w1}$, $B_{R1}$ . . . are formed, for example, by A1 layers provided on the word lines $W_1$, $W_2$ . . . . In addition, the common source region 21 is grounded.

Figure 8:
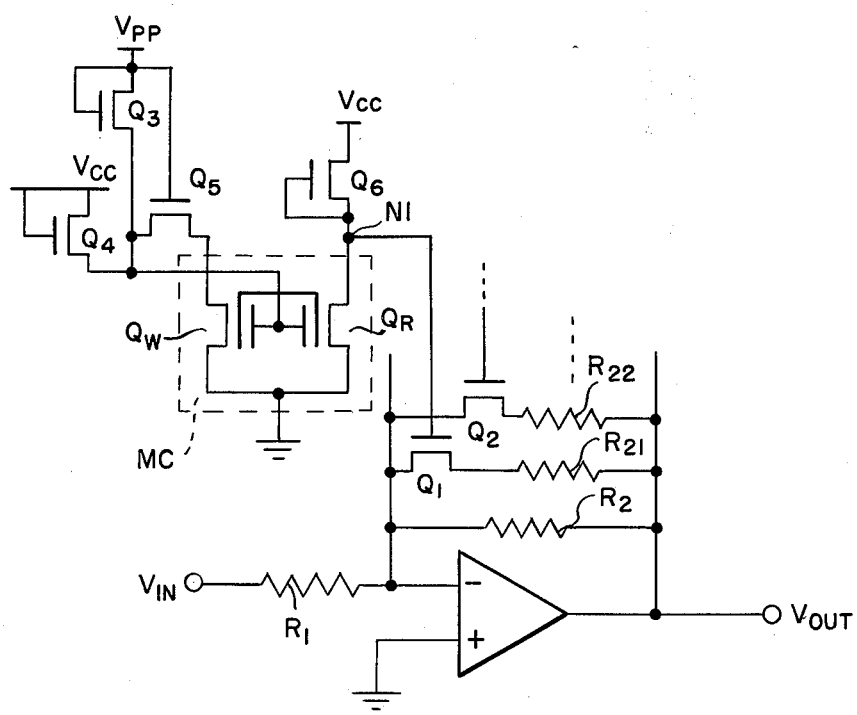
FIG. 8 outlines the schematic diagram of an analog invertor related to another embodiment of the present invention.

FIG. 8 is an analog invertor circuit related to another embodiment of the present invention. The analog invertor circuit receives an input of $V_{IN}$ and provides an polary-inverted output $V_{OUT} = -V_{IN}$. For this purpose the resistances $R_1$, $R_2$ must be formed in such a way that these resistances are accurately equal ($R_1 = R_2$). However, in practice, it is very difficult to realize $R_1 = R_2$ due to error in the production processes. In the present embodiment, therefore, the compensating resistors $R_{21}$, $R_{22}$, . . . are prepared in parallel to the resistor $R_2$ and the compensating transistors $Q_1$, $Q_2$ . . . are adequately turned ON in accordance with the result of a test after completion, thus connecting the resistors $R_{21}$, $R_{22}$, . . . in parallel to the resistor $R_2$. Thereby, $R_1 = R_2'$ ($R_2'$ is determined by $R_2$ and $R_{21}$, $R_{22}$ . . . ) can be accurately realized without relation to error in the production processes.

In the present embodiment, the said compensating transistors $Q_1$, $Q_2$ . . . are turned ON through injection of charges (electrons) into the floating gates of transistors $Q_R$ and $Q_W$ of the memory cells MC. The memory cell MC has almost the same structure as the aforementioned embodiment. The charges are injected by the transistor $Q_W$ through application of a high voltage to the test terminal $V_{pp}$ and as a result the transistor $Q_R$ is turned OFF, setting the terminal N1 to a high voltage level and turning ON the transistor $Q_1$. If no charge is injected, the transistor $Q_R$ is turned ON, setting terminal N1 to a low voltage level and turning OFF the transistor $Q_1$. This process is also adopted to the transistors $Q_2$, . . . .

In the case of this embodiment, the transistors $Q_R$, $Q_W$ of the memory cell MC can be formed by almost the same process as the other devices having the double polycrystalline silicon layers, except only for providing the high impurity region in the channel. Therefore, as in the case of this embodiment, even when the memory cell MC is provided within an ordinary circuit other than a memory device, such as analog circuit, little change of the production process is required. Moreover, since the charge injection voltage can be lowered and the read-out voltage can also be lowered, efficiency is far greater than the case where a memory cell having the conventional structure is used.

As explained previously, the invention provides a double gate type field effect transistor device which has improved the write efficiency and read-out efficiency by charge injection, and it, as a semiconductor memory device, can also be used effectively as the compensating switching circuit in an ordinary circuit such as an analog invertor, etc.

What is claimed is:

1. A semiconductor memory device, comprising: a substrate having a first conductivity type; a charge injection (write) transistor and a read transistor fabricated on the substrate, each transistor including source and drain regions which are formed in isolation on the substrate and which have a second conductivity type, a conductive floating gate between said source region and drain region and spaced apart from the substrate, a control gate spaced apart from said floating gate, and insulator means for mutually insulating the substrate, floating gate, and control gate; means for electrically connecting said floating gates of said charge injection transistor and said read transistor; means for connecting said control gates of said charge injection transistor and said read transistor in common to a first signal line; means for respectively connecting said drains of said charge injection transistor and said read transistor to different second and third signal lines; and means for connecting the sources of the charge injection transistor and the read transistor.

2. A semiconductor memory device as claimed in claim 1, wherein the electrical characteristics of said charge injection (write) transistor are different from the electrical characteristics of said read transistor.

3. A semiconductor memory device as claimed in claim 2, wherein the impurity concentration of said substrate portion between said source region and drain region of said charge injection transistor is higher than that of said read transistor.

4. A semiconductor memory device as claimed in claim 1, wherein charge is applied to the floating gate of said charge injection transistor by applying a predetermined voltage to said first signal line and a predetermined write voltage to the second signal line, and the stored information is read by applying a predetermined read voltage to said first signal line and detecting the degree of conductance of said read transistor via the said third signal line.

5. A semiconductor memory device as claimed in claim 1, wherein said sources of said charge injection transistor and said read transistor comprise a common impurity diffused region, said floating gates comprise a common first conductive layer and said control gates comprise a common second conductive layer.

6. A semiconductor memory device as claimed in claim 5, wherein said first conductive layer and the second conductive layer are comprised of polycrystalline silicon layers.

7. A semiconductor memory device as claimed in claim 1, 2, 3, 4, 5 or 6, wherein there are a plurality of memory cells fabricated on the substrate, each memory cell including one said charge injection transistor and one said read transistor, said memory cells being arranged in the form of matrix, with said first signal lines being arranged in the row direction to serve as word lines, said second signal lines being arranged in the column direction to serve as charge injection bit lines, and said third signal lines being arranged in the column direction to serve as read-out bit lines.

8. A semiconductor memory device as claimed in claim 7, wherein said word lines comprise polycrystalline silicon layers, portions of said word lines serving as said control gates, and wherein said charge injection bit lines and said read-out bit lines are comprised of metal conductor.

9. A semiconductor memory device as claimed in claim 7, further comprising charge injection circuit means for generating a write voltage; sense circuit means for detecting the degree of conductance of said read transistors; column decoder circuit means for connecting, during the charge injection, the selected said charge injection bit lines and said charge injection circuit means and also for connecting, at the time of a read-out operation, selected said read-out bit lines and the sense circuit means; and word decoder circuit means for applying a predetermined voltage to the selected word lines.

10. A semiconductor memory device as claimed in claim 1, 2, 3, 4, 5, or 6, further comprising means for continuously connecting a voltage source to the drain of the read transistor; and a switching element having an input connected to the the drain said read transistor, said switching element being turned ON and OFF by differences in potential levels at the drain of said read transistor due to differences in the degrees of conductance of said read transistor.

11. A semiconductor memory device as claimed in claim 10, further comprising an amplifier having an output and an inverting input; an input resistor connected to the inverting input; a feedback resistor connected between the output and the inverting input; and a compensating resistor series-connected to said switching element, the series of the switching element and the compensating resistor being connected in parallel with one of the input resistor and the feedback resistor, the resistance value of one of said input resistor and feedback resistor being compensated in accordance with the charge on said floating gate for controlling the ON-OFF condition of said switching element.

* * * * *

UNITED STATES PATENT AND TRADEMARK OFFICE
CERTIFICATE OF CORRECTION

PATENT NO. : 4,403,307
DATED : September 6, 1983
INVENTOR(S) : Maeda

It is certified that error appears in the above-identified patent and that said Letters Patent is hereby corrected as shown below:

Front page, [57] ABSTRACT, line 3, "control gate" should be --control gates--;
line 3, "floating gate" should be --floating gates--;
line 5, "writing" should be --(writing)--;
line 9, "gate" should be --gates--;
line 11, "lines," should be --line,--;
line 13, insert following sentence after "grounded". --Moreover, both transistors are formed in such a way as satisfying the optimum conditions.--.

Col. 1, line 33, "15 V" should be --15V--;
line 34, "20 V" should be --20V--;
line 43, delete "a".

UNITED STATES PATENT AND TRADEMARK OFFICE
CERTIFICATE OF CORRECTION

PATENT NO. : 4,403,307

DATED : September 6, 1983

INVENTOR(S) : Maeda

It is certified that error appears in the above-identified patent and that said Letters Patent is hereby corrected as shown below:

Col. 2, line 12, "narrow" should be --narrows--;
      line 51, after "is" insert --a--;
      line 66, after "positions" insert --on--.

Col. 3, line 49, "from" should be --by--.

Col. 4, line 52, delete "of".

Col. 5, line 58, "an" (second occurrence) should be --a--;
      line 59, "polary-inverted" should be --polarity-inverted--.

Col. 8, line 19, delete "the" (first occurrence).

Signed and Sealed this

Twenty-seventh Day of March 1984

[SEAL]

Attest:

GERALD J. MOSSINGHOFF

Attesting Officer

Commissioner of Patents and Trademarks